(12) United States Patent
Stoltenberg et al.

(10) Patent No.: US 10,283,482 B2
(45) Date of Patent: May 7, 2019

(54) WIRE BONDING METHODS AND SYSTEMS INCORPORATING METAL NANOPARTICLES

(71) Applicant: LOCKHEED MARTIN CORPORATION, Bethesda, MD (US)

(72) Inventors: Randall Mark Stoltenberg, Palo Alto, CA (US); Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/852,876

(22) Filed: Dec. 22, 2017

(65) Prior Publication Data

US 2018/0138143 A1 May 17, 2018

Related U.S. Application Data

(62) Division of application No. 15/233,912, filed on Aug. 10, 2016, now Pat. No. 9,881,895.

(60) Provisional application No. 62/206,807, filed on Aug. 18, 2015.

(51) Int. Cl.
*H01L 23/00* (2006.01)

(52) U.S. Cl.
CPC ............ *H01L 24/85* (2013.01); *H01L 24/45* (2013.01); *H01L 24/46* (2013.01); *H01L 24/48* (2013.01); *H01L 24/49* (2013.01); *H01L 24/78* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/45193* (2013.01); *H01L 2224/45664* (2013.01); *H01L 2224/48091* (2013.01); *H01L 2224/48465* (2013.01); *H01L 2224/49096* (2013.01); *H01L 2224/49175* (2013.01); *H01L 2224/7815* (2013.01);

(Continued)

(58) Field of Classification Search
CPC . H01L 2924/01013; H01L 2924/01029; H01L 2924/01079; H01L 2924/01022; H01L 2924/01078; H01L 2924/01015
USPC ................ 257/746; 438/610; 174/126.1, 260
See application file for complete search history.

(56) References Cited

U.S. PATENT DOCUMENTS 6,495,773 B1  12/2002  Nomoto et al.
7,736,414 B1   6/2010  Zinn (Continued)

*Primary Examiner* — Didarul A Mazumder
(74) *Attorney, Agent, or Firm* — Morgan, Lewis & Bockius LLP

(57) ABSTRACT

Wire bonding operations can be facilitated through the use of metal nanoparticle compositions. Both ball bonding and wedge bonding processes can be enhanced in this respect. Wire bonding methods can include providing a wire payout at a first location from a rolled wire source via a dispensation head, contacting a first metal nanoparticle composition and a first portion of the wire payout with a bonding pad, and at least partially fusing metal nanoparticles in the first metal nanoparticle composition together to form an adhering interface between the bonding pad and the first portion of the wire payout. The adhering interface can have a nanoparticulate morphology. Wire bonding systems can include a rolled wire source, a dispensation head configured to provide a wire payout, and an applicator configured to place a metal nanoparticle composition upon at least a portion of the wire payout or upon a bonding pad.

14 Claims, 5 Drawing Sheets

(52) U.S. Cl.
CPC .............. *H01L 2224/7825* (2013.01); *H01L 2224/78301* (2013.01); *H01L 2224/78601* (2013.01); *H01L 2224/78611* (2013.01); *H01L 2224/851* (2013.01); *H01L 2224/8502* (2013.01); *H01L 2224/8584* (2013.01); *H01L 2224/8593* (2013.01); *H01L 2224/85205* (2013.01); *H01L 2924/00014* (2013.01); *H01L 2924/01006* (2013.01); *H01L 2924/01013* (2013.01); *H01L 2924/01029* (2013.01); *H01L 2924/01047* (2013.01); *H01L 2924/01079* (2013.01)

(56) References Cited

U.S. PATENT DOCUMENTS

| | | | |
|---|---|---|---|
| 8,105,414 B2 | 1/2012 | Zinn | |
| 8,192,866 B2 | 6/2012 | Golightly et al. | |
| 8,486,305 B2 | 7/2013 | Zinn et al. | |
| 8,834,747 B2 | 9/2014 | Zinn | |
| 9,005,483 B2 | 4/2015 | Zinn et al. | |
| 9,095,898 B2 | 8/2015 | Zinn | |
| 2003/0192019 A1* | 10/2003 | Goto | G06F 17/5068 716/112 |
| 2008/0105960 A1 | 5/2008 | See et al. | |
| 2010/0000762 A1* | 1/2010 | Yang | H05K 3/1283 174/126.1 |
| 2013/0175677 A1* | 7/2013 | Chang | H01L 24/48 257/673 |
| 2014/0374467 A1* | 12/2014 | Yap | H01L 24/85 228/180.5 |
| 2015/0241418 A1* | 8/2015 | Wolfrum | B82Y 40/00 428/315.5 |
| 2016/0225718 A1* | 8/2016 | Mischitz | H01L 21/288 |

* cited by examiner

WIRE BONDING METHODS AND SYSTEMS INCORPORATING METAL NANOPARTICLES

CROSS-REFERENCE TO RELATED APPLICATIONS

This application is a divisional of U.S. patent application Ser. No. 15/233,912, filed Aug. 10, 2016, which claims the benefit of priority under 35 U.S.C. § 119 from U.S. Provisional Patent Application No. 62/206,807, filed Aug. 18, 2015, both of which are incorporated herein by reference in their entireties.

STATEMENT REGARDING FEDERALLY SPONSORED RESEARCH OR DEVELOPMENT

Not applicable.

FIELD

The present disclosure generally relates to wire bonding and, more specifically, to implementation of metal nanoparticles in wire bonding.

BACKGROUND

Automated wire bonding processes, particularly thermosonic wire bonding processes, have long been a popular and reliable way to connect semiconductor dies to packing terminals by way of a wire loop. Wire bonding processes are considered to be one of the most cost-effective and reliable ways to form interconnects within semiconductor systems. Conventional wire bonding processes include ball bonding and wedge bonding attachment motifs. Ball bonding methods apply energy to a wire, such as through brief exposure to an electric arc, to form a liquefied ball of metal (referred to in the art as a free air ball) upon the tip of the wire, which is then contacted with a bonding pad with further ultrasonic agitation to form a metallurgical bond. Wedge bonding methods differ in their application of energy to the sidewall of a wire to facilitate formation of a metallurgical bond. Undesirable pad splash, pad cratering, and damage to an underlying electronic component can sometimes occur in conventional wire bonding processes if they are not performed carefully.

Gold has traditionally been used as a wire material in wire bonding processes, particularly ball bonding processes, due to various operational advantages. Recent increases in the price of gold and accompanying price volatility have led to a search for alternative wire materials, with copper being an often-utilized choice in some applications. A chief advantage of copper compared to gold is the much lower cost of copper. Inductance and capacitance are also similar for these two metals. Copper, however, has other physical and metallurgical properties that differ significantly from those of gold. The differing properties of copper lead to competing advantages and disadvantages when utilizing this material in wire bonding processes. Copper can desirably be utilized at smaller wire diameters and provide higher electrical performance (i.e., lower parasitic resistance), improved thermal behavior, and greater mechanical strength (i.e., increased hardness) compared to gold. However, in order to overcome the greater hardness of copper, a higher energy input can be needed in conventional copper wire bonding processes to facilitate formation of a metallurgical bond. The higher energy input can result in an increased incidence of pad splash, pad cratering, interface spreading, and electronic component damage. Increased susceptibility of copper to oxidation and corrosion can also be problematic. These combined effects can be associated with an increased incidence of device failure, lower processing reliability, and limited throughput (yield). Indeed, the wire bonding community has implemented strict processing parameters for conventional copper wire bonding processes to reduce the risk of bonding pad damage. These rigorous processing parameters can be very difficult to maintain and can severely limit throughput. An additional difficulty associated with conventional copper wire bonding processes is the higher pitch sometimes produced with this metal compared to gold, which correspondingly decreases the attainable wire density upon a bonding pad or other surface. Although copper has the potential to provide performance that is at least comparable to that of gold, the foregoing limitations of conventional copper wire bonding processes presently limit use of this metal to various low-end consumer products.

In addition to the strict processing parameters typically utilized during conventional copper wire bonding processes, the hardness of this metal can also significantly increase wear within a wire bonding system in which it is used. Specifically, a capillary bonding head providing a copper wire payout can wear much faster than when a gold wire is provided. The increased system wear associated with copper can result in significant cost increases, particularly for high-volume applications, due to process downtime and material costs of replacing broken parts. Although more robust capillary bonding heads are in development, failure of this component still remains an issue in conventional copper wire bonding processes. Despite recent advances in dispensation technology, accelerated grain growth within the free air ball and low pullout forces can remain problematic in conventional copper wire bonding processes.

In view of the foregoing, improved systems and methods to facilitate wire bonding, particularly copper wire bonding systems and methods, would be of significant interest in the art. The present disclosure satisfies these needs and provides related advantages as well.

SUMMARY

In various embodiments, the present disclosure provides wire bonding methods that include providing a wire payout at a first location from a rolled wire source via a dispensation head, contacting a first metal nanoparticle composition and a first portion of the wire payout with a bonding pad in electrical communication with an electronic component, and at least partially fusing metal nanoparticles in the first metal nanoparticle composition together to form an adhering interface between the bonding pad and the first portion of the wire payout.

In other various embodiments, the present disclosure provides electrical packages including a bonding pad in electrical communication with an electronic component, a lead, a wire loop extending between the bonding pad and the lead, and an adhering interface having a nanoparticulate morphology disposed between the wire loop and at least one of the bonding pad and the lead.

In still other various embodiments, the present disclosure provides wire bonding systems including a rolled wire source, a dispensation head configured to provide a wire payout from the rolled wire source, and an applicator configured to place a metal nanoparticle composition upon at least a portion of the wire payout or upon a bonding pad.

The foregoing has outlined rather broadly the features of the present disclosure in order that the detailed description that follows can be better understood. Additional features and advantages of the disclosure will be described hereinafter. These and other advantages and features will become more apparent from the following description.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
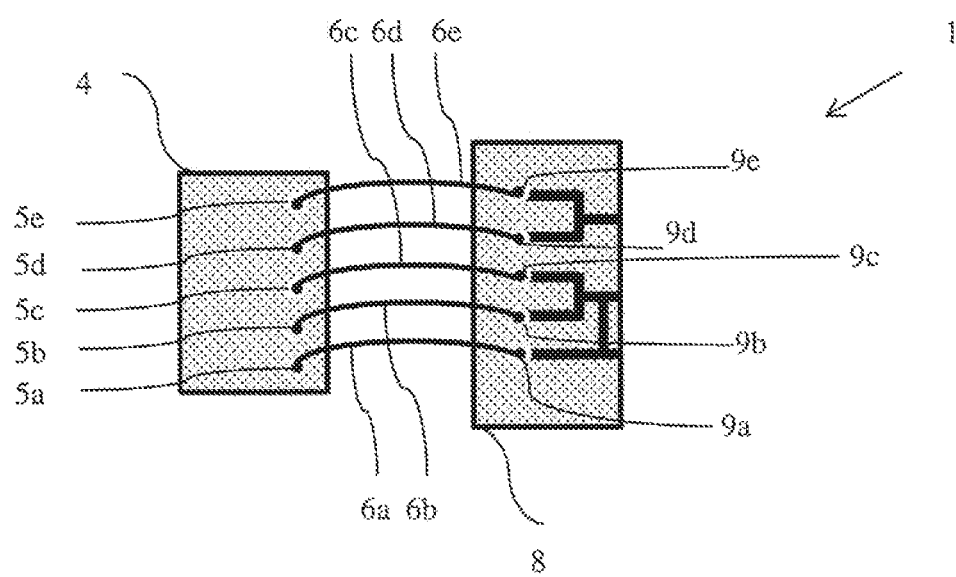
FIG. 1 shows an illustrative schematic of an electrical package in which multiple electrical connections are formed between a bonding pad and a lead.

The present disclosure is directed, in part, to wire bonding systems that are configured to incorporate metal nanoparticles in the wire bonding process. The present disclosure is also directed, in part, to wire bonding methods utilizing metal nanoparticles. The present disclosure is also directed, in part, to electrical packages having a wire loop connected to an adhering interface exhibiting a nanoparticulate morphology.

As discussed above, conventional wire bonding systems and methods suffer from certain disadvantages when adapted for use with copper. Although copper is advantageous compared to the more commonly used gold in terms of the former metal's cost and hardness, the hardness of copper can concurrently lead to several undesirable consequences when contacting a copper wire with a bonding pad. Copper's hardness can also lead to significant wear in the components of a wire bonding system. As a further issue, copper suffers from corrosion and oxide formation upon exposure to air, and engineering controls to include an inert atmosphere during copper wire bonding often need to be implemented. Gold, in contrast, is relatively inert toward oxide formation, and limited engineering controls are typically needed when working with this metal.

The present inventors discovered that metal nanoparticles, particularly copper nanoparticles, can facilitate improved wire bonding methods. Before further discussing the wire bonding methods and systems of the present disclosure, a brief introduction to metal nanoparticles and their properties will first be provided so that the various embodiments of the present disclosure can be better understood. Further details directed to metal nanoparticles and compositions thereof, such as nanoparticle paste compositions, are provided hereinbelow.

As used herein, the term "metal nanoparticle" refers to metal particles that are about 100 nm or less in size, without particular reference to the shape of the metal particles. Although metal nanoparticles can be substantially spherical in shape, they need not necessarily be so. Metal nanoparticles can exhibit a number of properties that differ significantly from those of the corresponding bulk metal. One property of metal nanoparticles that can be of particular interest is low-temperature consolidation that occurs at the metal nanoparticles' fusion temperature. As used herein, the term "fusion temperature" refers to the temperature at which a metal nanoparticle liquefies, thereby giving the appearance of melting. Upon cooling, the liquefied metal nanoparticles can fuse to form a consolidated mass having properties (e.g., melting point) approaching those of the corresponding bulk metal. As used herein, the terms "fusion," "consolidation," and various grammatical forms thereof refer to the coalescence or partial coalescence of liquefied metal nanoparticles to form a larger mass. Consolidation of the metal nanoparticles increases the effective grain size within the consolidated mass. Depending on how the consolidation process is performed, the grain size in the consolidated mass can maintain a nanoparticulate morphology, sometimes remaining near the size of the original metal nanoparticles, or approach that of the corresponding bulk metal.

The fusion temperature of metal nanoparticles is generally well below the melting point of the corresponding bulk metal. Upon decreasing in size, particularly below about 20 nm in equivalent spherical diameter, the temperature at which metal nanoparticles undergo liquefication drops dramatically from that of the corresponding bulk metal. For example, copper nanoparticles having a size of about 20 nm or less can have fusion temperatures of about 220° C. or below, or about 200° C. or below, in comparison to bulk copper's melting point of 1083° C. Thus, metal nanoparticles can allow metal working to take place at processing temperatures that are considerably below the melting point of the corresponding bulk metal.

The low fusion temperatures of metal nanoparticles allow these entities to facilitate wire bonding processes that can employ less energy than those conventionally used. Specifically, metal nanoparticles can facilitate low-energy contact and joining of wires that otherwise suffer from difficulties in conventional wire bonding processes, particularly those utilizing copper wires. By utilizing a decreased sonication time, power and/or application force, a strong metallurgical bond strength can be maintained in the processes of the present disclosure while significantly reducing the risk of component damage during the wire bonding process. It is believed that the wire bonding processes described herein can maintain metallurgical bond strengths near those produced in conventional wire bonding techniques while reducing the amount of applied stress by up to about 30%. Accordingly, the wire bonding processes described herein can allow more relaxed process controls and higher throughput to be realized compared to conventional wire bonding processes. In the case of copper, the processes of the present disclosure can advantageously allow copper wire bonding to be expanded into high-performance markets such as in the aerospace, medical, and automotive markets. Dense arrays of wedge bonding-type attachment to a bonding pad can also be realized by practicing the various embodiments of the present disclosure.

More specifically, the inventors discovered that the facile liquefication of metal nanoparticles can provide a transient liquid phase to promote ready attachment of a wire within an electrical package, such as to a bonding pad of an electronic component. Upon cooling and consolidation of the transient liquid phase, a nanoparticle-based interface can provide adherence between the wire and the bonding pad. Both ball bonding-type and wedge bonding-type processes can be enhanced in this regard. Such low-energy wire bonding processes can be especially advantageous in the case of copper wires, given the previously discussed issues associated with copper wire bonding processes. In addition, metal nanoparticles can allow decreased pitch values and increased wire densities to be realized during copper wire bonding due to the smaller bond areas (e.g., 1-1.3 times the copper wire diameter) attainable using the processes described herein. Specifically, wire bonding processes utilizing metal nanoparticles allow the wire to be bonded to a bonding pad without substantial deformation or spreading of the wire occurring. In contrast, wire deformation can result in doubling of the wire diameter or more in some conventional copper wire bonding processes. Formation of undesirable intermetallic phases can also be avoided in some instances by employing the processes of the present disclosure. Although metal nanoparticles can be particularly advantageous for promoting copper wire bonding, it is to be recognized that the wire bonding processes of the present disclosure can also be applied to other types of wires, including traditionally used gold wires or more non-traditional wires such as silver or aluminum. In a further extension, metal nanoparticles can also be used to facilitate joining of carbon nanotube (CNT) wires or other non-metallic wires to a bonding pad by employing the disclosure herein.

By incorporating metal nanoparticles in automated wire bonding processes, the rigorous controls that are often implemented in copper wire bonding processes can be significantly relaxed or modified. Although metal nanoparticles do not necessarily address the issues associated with air oxidation of copper, the inert processing conditions typically associated with this metal are not overly problematic to deal with. Furthermore, metal nanoparticles are not believed to exacerbate the air oxidation of copper or require modifications to the inert processing conditions utilized in conventional copper wire bonding processes.

In various embodiments, wire bonding methods of the present disclosure can include providing a wire payout at a first location from a rolled wire source via a dispensation head, contacting a first metal nanoparticle composition and a first portion of the wire payout with a bonding pad in electrical communication with an electronic component, and at least partially fusing metal nanoparticles in the first metal nanoparticle composition together to form an adhering interface between the bonding pad and the first portion of the wire payout.

In illustrative embodiments, the dispensation head can be a capillary bonding head or a piezoelectric tweezer bonding head. Piezoelectric tweezer bonding heads can be particularly desirable since they can be much less susceptible to wear than is a capillary bonding head. Piezoelectric tweezer bonding heads, for example, can be fabricated from ceramics such as tungsten carbide or other rugged materials. The piezoelectric forces can be used to hold, place and cut the wire payout in the processes described herein. In illustrative embodiments, the wire payout can protrude from the dispensation head about 20 to about 50 microns to facilitate contact with the first metal nanoparticle composition, either upon a tip or sidewall of the wire payout.

Both ball bonding-type and wedge bonding-type attachment motifs can be facilitated using the wire bonding processes disclosed herein. As indicated above, the wire payout usually does not substantially deform in the wire bonding processes described herein, thereby providing additional distinction over conventional ball bonding or wedge bonding processes. Accordingly, in some embodiments, the first portion of the wire payout contacted with the first metal nanoparticle composition can be a tip of the wire payout. In other embodiments, the first portion of the wire payout can be a sidewall of the wire payout. Tip contact of the first metal nanoparticle composition can result in a wire bonding motif that is similar to that of conventional ball bonding processes (i.e., end-on attachment of the wire), and sidewall contact can result in a wire bonding motif that is similar to that of conventional wedge bonding processes (i.e., side-on attachment of the wire). Wedge bonding-type attachment can also be realized through tip contact as well in the embodiments described herein. In either case, an at least partially fused metal nanoparticle composition can serve as an adhering interface between the wire payout and a bonding surface without substantial deformation of the wire taking place in some instances. In various embodiments, the adhering interface can range between about 1 micron to about 30 microns in thickness, or between about 1 micron to about 20 microns in thickness.

In various embodiments, the metal nanoparticles in the first metal nanoparticle composition can become at least partially fused together through any combination of heating, pressure, and sonication. In some embodiments, heating of the bonding pad (e.g., upon a heated stage) and subsequent cooling thereof can result in liquefication and consolidation of the metal nanoparticles to form an adhering interface. In other embodiments, methods of the present disclosure can include applying pressure, ultrasonic energy and/or heat to the first metal nanoparticle composition via the dispensation head. As discussed above, the application of pressure and/or ultrasonic energy can be less rigorous than in conventional wire bonding processes, which can be advantageous for the reasons discussed above. In still other embodiments, heating of the metal nanoparticle composition can take place through laser sintering, heated gas streams, or photolytic processes to promote consolidation of the metal nanoparticles. Additional details concerning the wire bonding process to the bonding pad are provided hereinafter.

In further embodiments, the processes of the present disclosure can be extended to produce an electronic package by forming a metallurgical bond in a second location. More specifically, the methods of the present disclosure can further include moving the dispensation head to a second location; contacting a second portion of the wire payout with a lead at the second location; adhering the wire payout to the lead, thereby forming a wire loop extending between the bonding pad and the lead; and severing the wire payout from the wire loop. A wedge bonding-type attachment motif can result at the second location.

In some embodiments, metal nanoparticles can be used to facilitate the formation of the metallurgical bond at the second location. More specifically, the methods of the present disclosure can include contacting a second metal nanoparticle composition and at least a portion of the wire payout with the lead, and at least partially fusing metal nanoparticles in the second metal nanoparticle composition together to form an adhering interface between the lead and at least a portion of the wire payout. Depending on various operational considerations, the first metal nanoparticle composition and the second metal nanoparticle composition can be the same or different. Separate reservoirs of the first metal nanoparticle composition and the second metal nanoparticle composition can be maintained nearby the bonding pad and the lead to expedite the wire bonding processes described herein.

In alternative embodiments, the metallurgical bond at the second location can be formed without utilizing metal nanoparticles. Formation of the metallurgical bond in this manner can occur similarly to conventional wire bonding processes.

The above operations can be iterated multiple times to form a plurality of wire loops extending between the bonding pad and one or more nearby leads. FIG. 1 shows an illustrative schematic of an electrical package in which multiple electrical connections are formed between a bonding pad and a lead. As shown in FIG. 1, electrical package 1 includes bonding pad 4 and chip 8. Chip 8 contains various leads and electrical circuitry disposed thereon. Wire loops 6a-6e extend between bonding pad 4 and chip 8. Interfaces 5a-5e provide a metallurgical bond between bonding pad 4 and first ends of corresponding wire loops 6a-6e. Similarly, interfaces 9a-9e allow a metallurgical bond to be established between the leads and second ends of corresponding wire loops 6a-6e. Interfaces 5a-5e can be of a ball bonding-type or wedge bonding type motif (i.e., end-on or side on), and interfaces 9a-9e can be of a wedge bonding-type motif. The second ends of wire loops 6a-6e are in electrical communication with a circuit defined on chip 8, which should be considered illustrative in nature and non-limiting. Likewise, although FIG. 1 has depicted 5 wire loops 6a-6e extending between bonding pad 4 and chip 8, it should be recognized that any number and configuration of wire loops can be present to accommodate the needs of a particular application. Such considerations related to the design of electrical package 1 lie within the purview of one having ordinary skill in the art. Wedge bonding-type motifs can be desirable due to their low profile (e.g., wire angles generally less than 45 degrees with respect to the bonding pad or lead, particularly less than about 30 degrees).

In regard to FIG. 1, it should be further noted that electrical package 1 resembles those produced by the systems and methods of the present disclosure, with the understanding that interfaces 5a-5e and 9a-9e can have a nanoparticulate morphology in the various embodiments of the present disclosure. Without the nanoparticulate morphology being present in the various interfaces or without the various interfaces being present at all, electrical package 1 can resemble those produced by conventional wire bonding processes. Accordingly, in various embodiments, the present disclosure describes electrical packages including a bonding pad in electrical communication with an electronic component, a lead, a wire loop extending between the bonding pad and the lead, and an adhering interface having a nanoparticulate morphology disposed between the wire loop and at least one of the bonding pad and the lead. Further disclosure in this regard, particularly concerning the nanoparticulate morphology, is provided hereinbelow.

In some embodiments, an adhering interface can be present between at least the bonding pad and the wire loop. In other embodiments, an adhering interface can be present between the wire loop and both the bonding pad and the lead.

Figure 2:
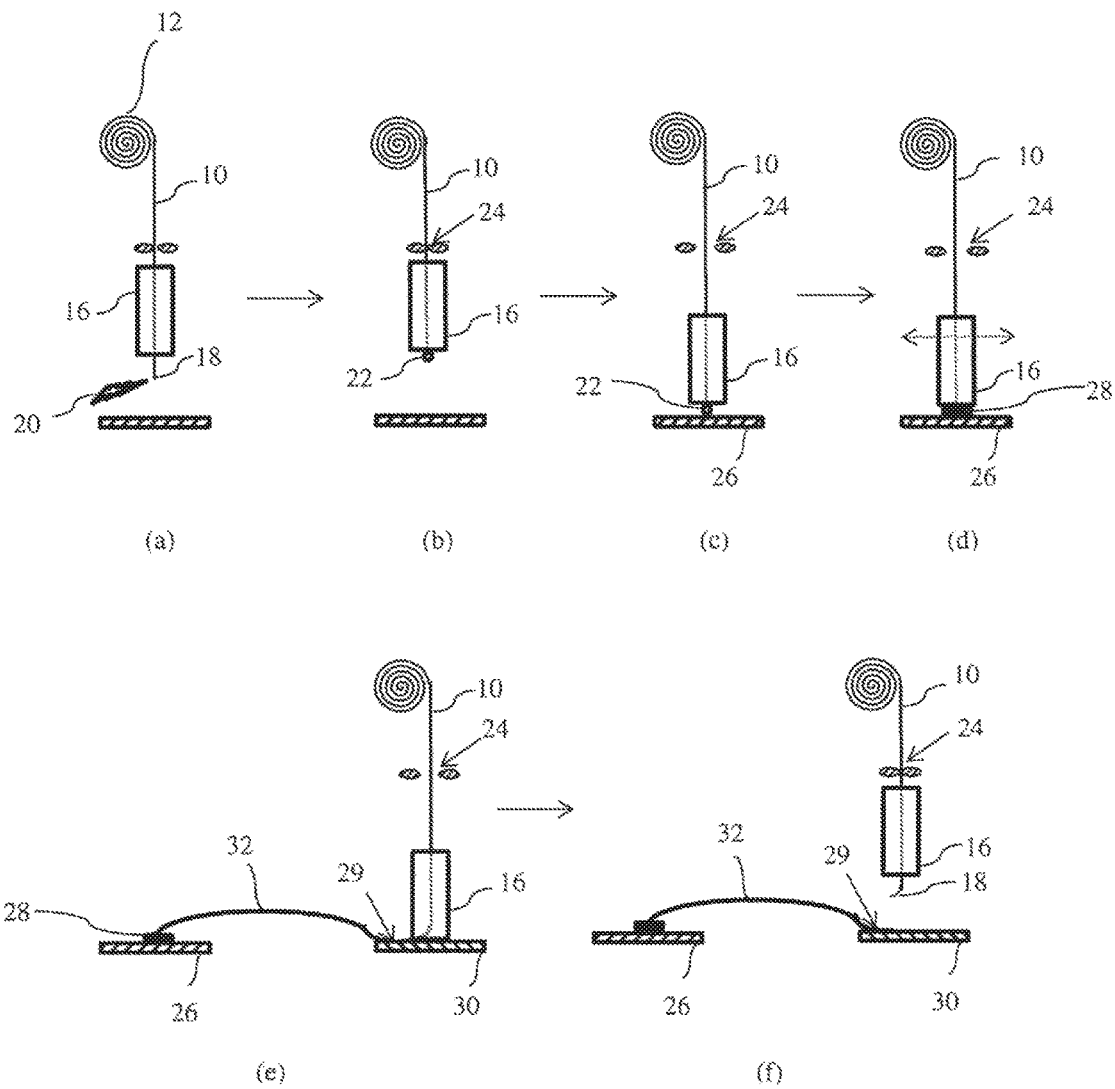
FIG. 2 shows a schematic illustrating various operations in a conventional wire bonding process.

Before further discussing the wire bonding systems and methods of the present disclosure, in which metal nanoparticles are employed, a conventional wire bonding system and method will first be described in brief so that the various embodiments of the present disclosure can be better understood. FIG. 2 shows a schematic illustrating various operations in a conventional wire bonding process. As shown in operation (a), wire payout 10 from rolled wire source 12 is provided through capillary bonding head 16. Tip 18 of wire payout 10 protrudes from the bottom of capillary bonding head 16. Electric arc 20 is fired at tip 18 (electric arc source not depicted), which results in free air ball 22 being formed at the bottom of capillary bonding head 16, as shown in operation (b).

While free air ball 22 is being formed, wire payout 10 is vertically held in place by clamp 24. As shown in operation (c), upon retraction of clamp 24, capillary bonding head 16 descends such that free air ball 22 contacts bonding pad 26. While free air ball 22 contacts bonding pad 26, capillary bonding head 16 is laterally reciprocated in operation (d) with an input of ultrasonic energy to spread out free air ball 22, thereby forming a metallurgical bond via interface 28.

Upon completion of operation (d), a first end of wire payout 10 is attached to bonding pad 26 by a first metallurgical bond. Although FIG. 2 shows tip bonding to pad 26, wedge bonding can result in a related manner. In either case, the first metallurgical bond has a considerably wider spread than the diameter of wire payout 10. Thereafter, capillary bonding head 16 is raised and moved to a second location to facilitate formation of a second metallurgical bond. Since clamp 24 remains open, the length of wire payout 10 extends in this process. As shown in operation (e), after capillary bonding head 16 is moved, side 29 of wire payout 10 contacts chip 30. Application of heat and/or pressure results in formation of a second metallurgical bond upon chip 30, leaving wire loop 32 extending between bonding pad 26 and chip 30. The second metallurgical bond is a wedge bond. Upon raising capillary bonding head 16 and closing clamp 24 in operation (f), wire payout 10 severs, leaving tip 18 newly protruding from capillary bonding head 16. At this juncture, the wire bonding system is ready for formation of another wire bond by repeating the processes described above.

Figure 4:
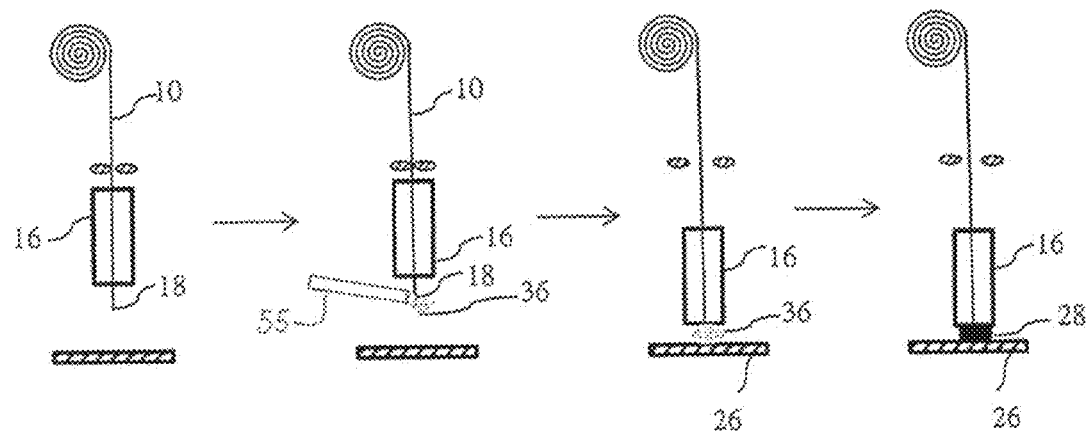
FIG. 4 shows a schematic of an illustrative wire bonding process in which metal nanoparticles are applied to the tip of a wire payout and undergo direct liquefication upon a bonding pad to form a metallurgical bond.
Figure 5:
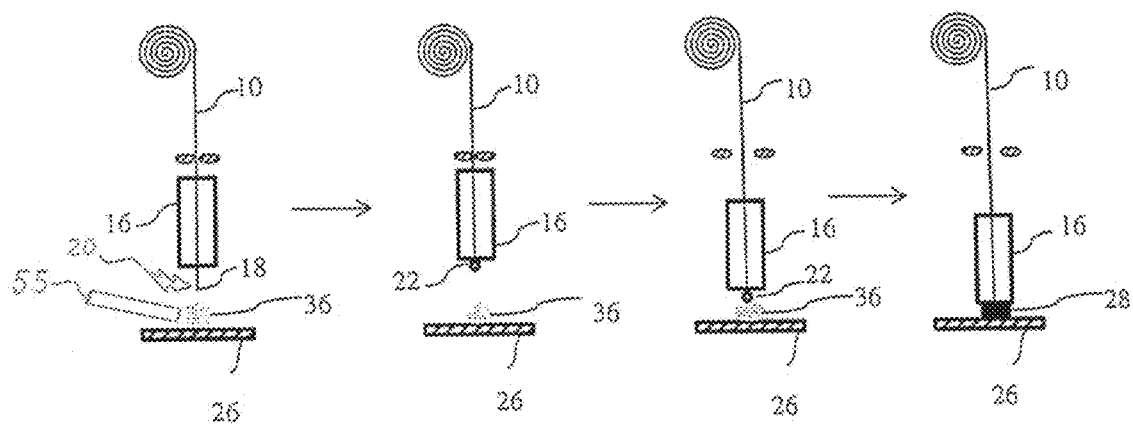
FIGS. 5 and 6 show schematics of illustrative wire bonding processes in which metal nanoparticles are applied to a bonding pad before being contacted with the tip of a wire payout.
Figure 6:
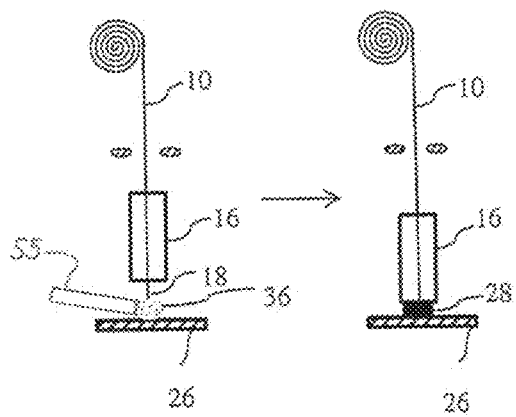

The methods of the present disclosure can incorporate various aspects of conventional wire bonding processes, such as those illustratively depicted in FIG. 2, which have been further modified by incorporating metal nanoparticles to facilitate formation of a metallurgical bond. As indicated above, the methods of the present disclosure include contacting a first metal nanoparticle composition and a first portion of the wire payout with a bonding pad. The first metal nanoparticle composition can be applied to the tip or sidewall of the wire payout before being contacted with the bonding pad (FIGS. 3 and 4) or directly to the bonding pad before being contacted with the tip or sidewall of the wire payout (FIGS. 5 and 6). Techniques which can be applied for applying the metal nanoparticle composition can include, for example, spray deposition, ink jet printing, screen printing, aerosol printing, template printing, syringe deposition, spreading, painting, stamping, dipping, dragging, drop deposition, and the like. Whether the first nanoparticle composition is being applied to the wire payout or to the bonding pad can determine the suitability of a given deposition technique. For example, in some embodiments, the tip of the wire payout can be dragged through a thin layer of the first metal nanoparticle composition (e.g., <1 mm in thickness) to provide a minimal amount of metal nanoparticles thereon. Spray coating, ink jet printing, aerosol printing, or drop deposition can be particularly suitable for application of the first metal nanoparticle composition upon the bonding pad.

These processes can deposit the metal nanoparticle composition over a large area, and localized consolidation can take place in each location where contact with the wire payout takes place.

Figure 3:
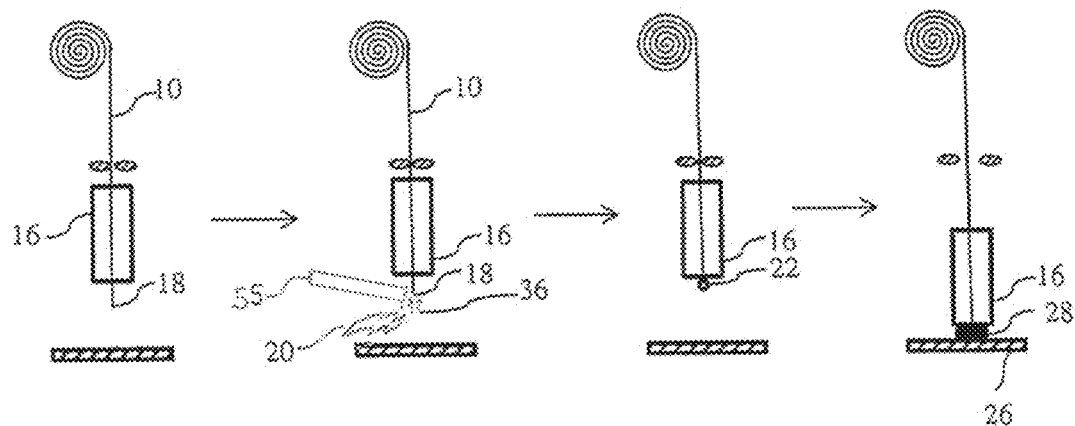
FIG. 3 shows a schematic of an illustrative wire bonding process in which metal nanoparticles are applied to the tip of a wire payout and undergo liquefication to form a free air ball.

FIG. 3 shows a schematic of an illustrative wire bonding process in which metal nanoparticles are applied to the tip of a wire payout and undergo liquefaction to form a free air ball. As shown in FIG. 3, metal nanoparticle coating 36 can be applied to tip 18 through a suitable technique (e.g., stamping) using an applicator 55, leaving tip 18 better conditioned for forming a metallurgical bond. The low fusion temperature of metal nanoparticles in metal nanoparticle coating 36 can allow free air ball 22 to be formed at a lower temperature than would be possible in conventional wire bonding processes conducted with the same bulk metal. Although FIG. 3 has again shown electric arc 20 for forming free air ball 22, it is to be recognized that alternative heat sources can be used to affect heating in order to take advantage of the low fusion temperature of metal nanoparticles. For example, a laser, direct radiant heating, heated gas, or photolytic heating can be utilized as alternative heating sources in some embodiments to affect activation of the metal nanoparticles. These heat sources can also be used in other embodiments described herein. Since the resulting ball diameter can be smaller than in conventional wire bonding processes, less vertical force and lower ultrasonic energy can be input for forming interface 28 upon bonding pad 26. Otherwise, the wire bonding process can continue in a manner similar to that described above in reference to FIG. 2.

Alternately, separate formation of free air ball 22 can be avoided altogether in some instances by directly contacting metal nanoparticle coating 36 with bonding pad 26. Application of heat, pressure, and/or ultrasonic energy to metal nanoparticle coating 36 can produce a transient liquid phase upon tip 18, which can form a metallurgical bond upon re-solidification. FIG. 4 shows a schematic of an illustrative wire bonding process in which metal nanoparticles are applied to the tip of a wire payout using the applicator 55 and undergo direct liquefaction upon a bonding pad to form a metallurgical bond. Other than circumventing formation of free air ball 22, the method illustrated in FIG. 4 is similar to that shown in FIG. 3 and may be better understood by reference thereto.

Although FIGS. 3 and 4 have depicted application of the first metal nanoparticle composition to tip 18 of wire payout 10, it is to be recognized that the first metal nanoparticle composition can also be applied to the sidewall of wire payout 10 using the applicator 55 in a similar manner consistent with the disclosure herein. In the case of sidewall application of the first nanoparticle composition to wire payout 10, the wire bonding to bonding pad 26 can be wedge bonding-type (i.e., side-on). The wire angle with respect to bonding pad 26 can be less than about 45 degrees or less than about 30 degrees, for example.

As indicated above, the first metal nanoparticle composition can be directly applied to the bonding pad in alternative embodiments of the present disclosure. FIGS. 5 and 6 show schematics of illustrative wire bonding processes in which metal nanoparticles are applied to a bonding pad using the applicator 55 before being contacted with the tip of a wire payout. As shown in FIG. 5, free air ball 22 can be formed and then contacted with metal nanoparticle coating 36 upon bonding pad 26. Interface 28 can then form in a manner similar to that described above. In contrast, in FIG. 6, separate formation of free air ball 22 can be avoided altogether by directly contacting tip 18 with metal nanoparticle coating 36 upon bonding pad 26. Upon liquefying the metal nanoparticles, interface 28 can form in a manner similar to that described above. Again, it is to be recognized that sidewall contact of the wire payout can take place in an alternative configuration to that depicted in FIG. 6. Sidewall contact of the wire payout can be particularly desirable due to increased wire density, decreased wire profile, and improved metallurgical bond strength over that resulting from tip contact.

Accordingly, in some embodiments, the first metal nanoparticle composition can be contacted with at least the tip of the wire payout before being contacted with the bonding pad. In some or other embodiments, the first metal nanoparticle composition can be contacted with the bonding pad before being contacted with the tip of the wire payout. In still other embodiments, the first metal nanoparticle composition can be contacted with a sidewall of the wire payout before or after being contacted with the bonding pad. In either case, formation of the interface can then take place in accordance with the disclosure above.

FIGS. 3-6 described and depicted above are directed to formation of a first metallurgical bond upon a bonding pad. As discussed above, another metallurgical bond can be formed in a second location to establish a wire loop extending between the first location and the second location. In some instances, conventional wire bonding techniques can be employed to form a metallurgical bond at the second location. For example, in some embodiments, a side of the wire payout can be contacted with the wire payout at the second location, and heat and ultrasonic energy can be applied to form the metallurgical bond at the second location. More desirably, however, techniques incorporating metal nanoparticles and related to those described above can be used to facilitate formation of the metallurgical bond at the second location. Specifically, a second metal nanoparticle composition can be used at the second location to facilitate formation of the metallurgical bond.

Accordingly, in some embodiments, methods of the present disclosure can include contacting a second metal nanoparticle composition with the wire payout before the wire payout is contacted with the lead. In the case of the second location, the second metal nanoparticle composition is contacted with the sidewall of the wire payout. Afterward, the metal nanoparticles in the second nanoparticle composition can be consolidated to form an adhering interface at the lead, in which the wire loop is attached to the lead via its sidewall. In other embodiments, the second metal nanoparticle composition can be contacted with the lead before the lead is contacted with the wire payout. Again, consolidation of the metal nanoparticles can form an adhering interface upon a suitable input of energy, and the wire loop can be attached to the lead via its sidewall. Since the wire bonding processes taking place at the second location bear similarities to those employed at the first location, the wire bonding processes shown in FIGS. 3-6 can be used to understand the wire bonding processes taking place at the second location, while also making further reference to FIG. 2. Accordingly, wire bonding processes utilizing metal nanoparticles at the second location will not be described herein in further detail or shown in the figures in the interest of brevity.

In some embodiments, multiple dispensation heads can operate in tandem to form a plurality of metallurgical bonds at the bonding pad and the lead. In some embodiments, the wire payout can be cut prior to contacting the lead to better facilitate contact with the second nanoparticle composition. In some embodiments, a line of metallurgical bonds can be fabricated using multiple dispensation heads, with alternating dispensation heads forming a metallurgical bond at the bonding pad for a first wire and a second dispensation head forming a metallurgical bond at the lead for a second wire. In some embodiments, such processes can be facilitated by directly printing the nanoparticle compositions onto the bonding pad and the lead.

As indicated above, the wire bonding processes described herein can be particularly advantageous for wire bonding processes utilizing copper wire. However, the methods described herein should not be considered to be limited in this respect. Forms of the wire payout suitable for use in conjunction with the systems and methods of the present disclosure can include, for example, copper wire, gold wire, aluminum wire, silver wire, carbon nanotube ropes, drawn carbon nanotube fibers, or any combination therein. As used herein, the term "carbon nanotube ropes" refers to a plurality of carbon nanotubes that are held together by van der Waals forces in an elongated fiber. As used herein, the term "drawn carbon nanotube fiber" refers to an elongated fiber formed from carbon nanotubes that are drawn from a carbon nanotube solution or suspension, such as a dispersion of carbon nanotubes in various types of superacid media.

In some embodiments, palladium-coated copper wires can be utilized as the wire payout. Although palladium-coated copper wires can provide increased oxidation resistance, they are harder than are pristine copper wires. Hence, the temperature and/or the applied ultrasonic energy can need to be raised when utilizing such wires in conventional wire bonding processes but not those disclosed herein. Alternative techniques for conveying oxidation resistance involve modification of the metal nanoparticle composition, as discussed further herein. Palladium-coated copper wires can also be useful for lowering contact resistance in embodiments, in which carbon nanotubes are present in the wire payout. Palladium can be included in the nanoparticle composition for similar purposes.

The diameter of the wire payout used in the various embodiments of the present disclosure can reside within a similar range to that utilized in conventional wire bonding processes. In general, the diameter of the wire payout can range between about 5 microns and about 100 microns, or between about 10 microns and about 50 microns, or between about 15 microns and about 30 microns. In the specific case of gold wire, the diameter of the wire payout can range between about 18 microns and about 25 microns, in some instances. For copper wire, in contrast, the effective diameter range can be about 2.5 microns smaller, in some instances, due to an increased size of the free air ball formed with this metal in conventional wire bonding processes. Other metal wires can reside within similar size ranges. By employing the processes described herein, much smaller interfaces can be formed than in conventional wire bonding processes in which a free air ball is formed.

Contact pressures for forming metallurgical bonds from the wire payout can likewise reside within a similar range to that of conventional wire bonding processes, or even lower pressures can be used. In various embodiments, a pressure of about 0.01 N/wire to about 0.6 N/wire can be utilized, as applied through the dispensation head (e.g., the capillary bonding head or the tweezers in piezoelectric tweezer bonding head). The capillary bonding head or tweezers can push down upon the metal nanoparticle composition to apply pressure and transmit ultrasonic energy and/or heat thereto. The actual amount of contact pressure to be applied can vary depending upon the amount of ultrasonic energy that is applied. In various embodiments, the ultrasonic power can range between about 100 mW to about 500 mW at a frequency of about 60-120 kHz. Heat can also be supplied by the dispensation head in some instances.

Similarly, the temperature to which the metal nanoparticle composition is heated can vary depending upon the amount of applied pressure and/or ultrasonic energy. The nature of the bonding pad and/or the lead can also dictate the effective temperature range over which the metal nanoparticle composition needs to be heated. In various embodiments, the metal nanoparticle composition can be heated within a range of about 80° C. to about 250° C., or within a range of about 120° C. to about 220° C., or within a range of about 140° C. to about 180° C., or within a range of about 180° C. to about 250° C. The nature of the metal wire and/or the metal nanoparticles and their fusion temperature can also dictate the effective temperature range over which heating can occur. Heating can take place through various processes such as, for example, radiant heating, laser sintering, heated gas streams, photolytic heating, or any combination thereof.

In various embodiments, the systems and methods of the present disclosure can utilize an inert atmosphere. In some embodiments, the inert atmosphere can be localized in the region where a metallurgical bond is being formed. Use of an inert atmosphere can be particularly desirable when utilizing copper wire and/or copper nanoparticles to promote formation of a metallurgical bond. Suitable techniques and equipment for supplying an inert gas to a location where a metallurgical bond is being formed will be familiar to one having ordinary skill in the art and will not be addressed further herein. In some embodiments, helium, neon, argon, or nitrogen represent illustrative inert gases that can be suitable for establishing an inert atmosphere in the systems and methods of the present disclosure.

In more specific embodiments, the systems and methods of the present disclosure can utilize copper nanoparticles to promote formation of a metallurgical bond. Copper nanoparticles can be particularly desirable for use in conjunction with copper wires, since such nanoparticles can avoid the formation of intermetallic phases that might otherwise be formed. Suitable copper nanoparticles, copper nanoparticle compositions, and methods for forming copper nanoparticles and copper nanoparticle compositions are provided hereinbelow. It is to be recognized that other metal nanoparticles and compositions thereof can be synthesized using comparable synthetic methodology and can be substituted for copper nanoparticles to accommodate various operational considerations that will be familiar to one having ordinary skill in the art. For example, other suitable metal nanoparticles and metal nanoparticle compositions can include those containing copper, silver, gold, palladium, aluminum, tin and the like.

As indicated above, the metal nanoparticles forming a metallurgical bond or adhering interface in the wire bonding processes of the present disclosure can maintain a nanoparticulate morphology upon undergoing liquefication and subsequent re-solidification. In general, the interface can have a grain size that is smaller than that of the wire diameter. For example, in some embodiments, the interfaces formed between the bonding pad and the wire payout and/or the between the lead and the wire payout can have a grain size of about 250 nm or less, particularly within a size range of about 50 nm to about 200 nm. At this grain size, the interfaces can have pores that range in size between about 50 nm to about 500 nm, and the porosity can range between about 2% to about 30%. The pores at these grain sizes are substantially non-interconnected with one another, thereby limiting contact of the metal nanoparticles or consolidated nanoparticle grains with the outside atmosphere or other materials. In alternative embodiments of the present disclosure, more extensive consolidation of the metal nanoparticles can lead to even larger grain sizes, approaching that of bulk metal, and even lower porosity values can be utilized.

A number of scalable processes for producing bulk quantities of metal nanoparticles, such as copper nanoparticles, in a targeted size range have been developed, several of which are further described hereinbelow. Such processes typically involve reducing a metal precursor in the presence of a surfactant, followed by isolation of the metal nanoparticles from the reaction mixture. The metal nanoparticles can have a surfactant coating on their exterior surface, which can further tailor the properties of the metal nanoparticles. Such metal nanoparticles can be further dispersed in a solvent for improved workability and dispensation, or formulated into a paste. Exemplary compositions are described hereinbelow.

Particularly facile metal nanoparticle fabrication techniques are described in commonly owned U.S. Pat. Nos. 7,736,414, 8,105,414, 8,192,866, 8,486,305, 8,834,747, 9,005,483, and 9,095,898, each of which is incorporated herein by reference in its entirety. As described therein, metal nanoparticles can be fabricated in a narrow size range by reduction of a metal salt in a solvent in the presence of a suitable surfactant system. Further description of suitable surfactant systems follows below. In the presence of a suitable surfactant system, metal nanoparticles having a size range between about 1 nm and about 50 nm and including a surfactant coating thereon can be produced. In more particular embodiments, metal nanoparticles having a surfactant coating and a size range between about 1 nm and about 20 nm, or between about 1 nm and about 10 nm, or between about 1 nm and about 7 nm, or between about 1 nm and about 5 nm can be produced.

Suitable organic solvents for solubilizing metal salts and forming metal nanoparticles can include aprotic solvents such as, for example, formamide, N,N-dimethylformamide, dimethyl sulfoxide, dimethylpropylene urea, hexamethylphosphoramide, tetrahydrofuran, glyme, diglyme, triglyme, tetraglyme, and the like. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or a tetraalkylammonium borohydride).

Figure 7:
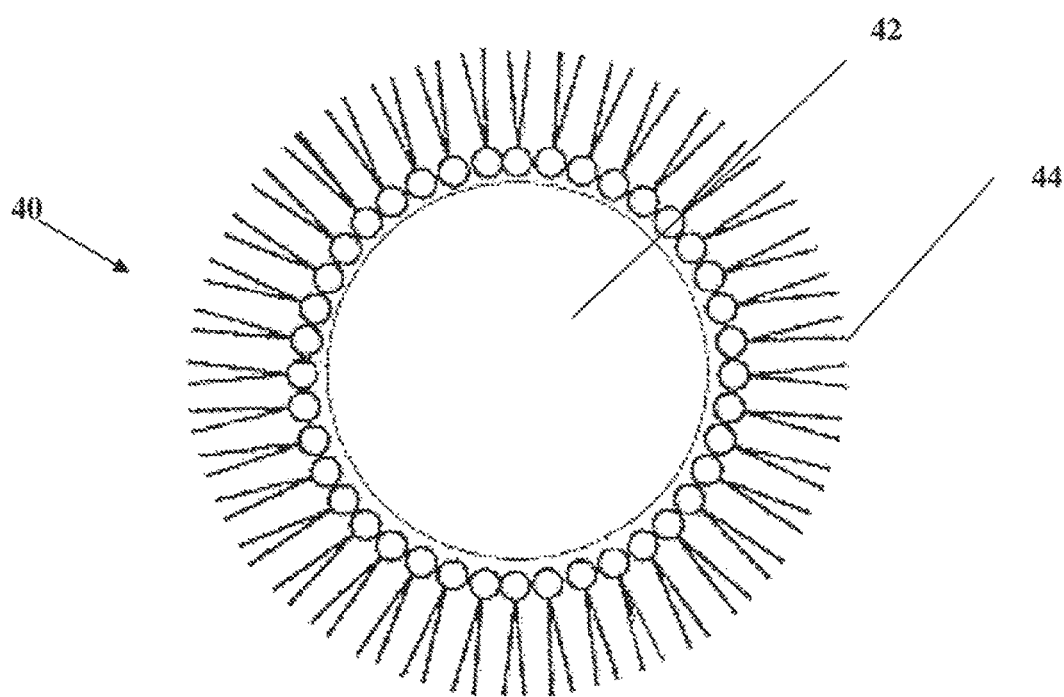
FIGS. 7 and 8 show presumed structures of illustrative metal nanoparticles having a surfactant coating thereon.
Figure 8:
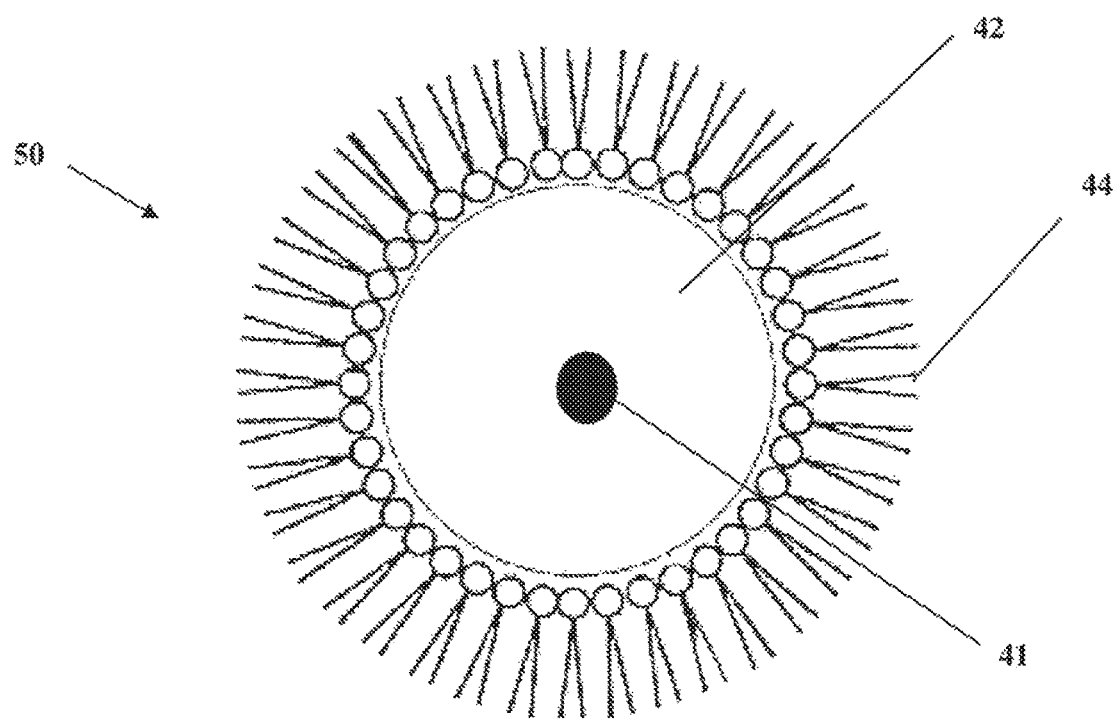

Without being bound by any theory or mechanism, FIGS. 7 and 8 show presumed structures of illustrative metal nanoparticles having a surfactant coating thereon. As shown in FIG. 7, metal nanoparticle 40 includes metallic core 42 and surfactant layer 44 overcoating metallic core 42. Surfactant layer 44 can contain any combination of surfactants, as described in more detail below. Metal nanoparticle 50 shown in FIG. 8 is similar to that depicted in FIG. 7, but metallic core 42 is grown about nucleus 41, which can be a metal that is the same as or different than that of metallic core 42. Because nucleus 41 is buried deep within metallic core 42 in metal nanoparticle 50, it is not believed to significantly affect the overall nanoparticle properties.

In various embodiments, the surfactant coating upon the metal nanoparticles contains one or more surfactants. The surfactant coating can be formed on the metal nanoparticles during their synthesis. Formation of a surfactant coating on the metal nanoparticles during their synthesis can desirably tailor the ability of the metal nanoparticles to fuse to one another, limit their agglomeration with one another, and promote the formation of a population of metal nanoparticles having a narrow size distribution.

In various embodiments, the surfactant system used to prepare the metal nanoparticles can include one or more surfactants. The differing properties of various surfactants can be used to tailor the properties of the metal nanoparticles, such as their size and reactivity. Factors that can be taken into account when selecting a surfactant or combination of surfactants for use in synthesizing metal nanoparticles can include, for example, ease of surfactant dissipation from the metal nanoparticles during nanoparticle fusion, nucleation and growth rates of the metal nanoparticles, affinity of the surfactants with the chosen metal, and the like.

In some embodiments, an amine surfactant or combination of amine surfactants, particularly aliphatic amines, can be used during the synthesis of metal nanoparticles. Amine surfactants, in particular, can have a high affinity for bonding to copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. This surfactant system can be particularly efficacious for forming copper nanoparticles having a narrow size range distribution. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure versus having ready volatility and/or ease of handling. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used in some embodiments. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but can be readily dissociable during metal nanoparticle fusion.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for use in forming metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with forming metal nanoparticles can be envisioned by one having ordinary skill in the art.

Suitable pyridines can include both pyridine and its derivatives. Illustrative pyridines that can be suitable for use in forming metal nanoparticles include, for example, pyridine, 2-methylpyridine, 2,6-dimethylpyridine, collidine, pyridazine, and the like. Chelating pyridines such as bipyridyl chelating agents can also be used. Other pyridines that can be used in conjunction with forming metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be used in forming metal nanoparticles include, for example, trimethylphosphine, triethylphosphine, tributylphophine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with forming metal nanoparticles can be envisioned by one having ordinary skill in the art Suitable thiols can have a formula of RSH, where R is an alkyl or aryl group having from about 4 to about 16 carbon atoms. Illustrative thiols that can be used for forming metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with forming metal nanoparticles can be envisioned by one having ordinary skill in the art.

In some embodiments of the present disclosure, metal nanoparticles can be dispersed in an organic matrix containing one or more organic solvents to form a metal nanoparticle composition. In some embodiments, this composition can be in the form of a paste. Use of the term "paste" does not necessarily imply an adhesive function. The term "nanoparticle paste formulation" may be used synonymously herein with the term "metal nanoparticle composition." In some embodiments, at least some of the one or more organic solvents can have a boiling point of about 100° C. or greater. In some embodiments, at least some of the one or more organic solvents can have a boiling point of about 200° C. or greater. In some embodiments, the one or more organic solvents can have boiling points ranging between about 50° C. and about 200° C. Use of high boiling organic solvents can desirably increase the pot life. In some embodiments, at least some of the one or more organic solvents can have a boiling point that is higher than those of the surfactants associated with the metal nanoparticles. Accordingly, in such embodiments, the surfactant(s) can be removed from the metal nanoparticles by evaporation before removal of the organic solvent(s) takes place.

In some embodiments, an organic matrix containing one or more hydrocarbons, one or more alcohols, one or more amines, and one or more organic acids can be especially desirable. Without being bound by any theory or mechanism, it is believed that this combination of organic solvents can facilitate the removal and sequestration of surfactant molecules surrounding the metal nanoparticles, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

In some embodiments, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In some embodiments, the organic matrix can contain one or more alcohols. In various embodiments, the alcohols can include monohydric alcohols, diols, triols, glycol ethers (e.g., diethylene glycol and triethylene glycol), alkanolamines (e.g., ethanolamine, triethanolamine, and the like), or any combination thereof. In some embodiments, one or more hydrocarbons can be present in combination with one or more alcohols. As discussed above, it is believed that alcohol and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present in the nanoparticle compositions include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy)ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present in the organic matrix include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the organic matrix include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

In addition to metal nanoparticles and organic solvents, other additives can also be present in the nanoparticle paste formulations. Such additional additives can include, for example, rheology control aids, thickening agents, micron-scale conductive additives, nanoscale conductive additives, and any combination thereof. Chemical additives can also be present. As discussed hereinafter, the inclusion of micron-scale conductive additives can be particularly advantageous.

In some embodiments, the micron-scale conductive additives can be micron-scale metal particles. In some embodiments, the nanoparticle paste formulations can contain about 0.01% to about 15% micron-scale metal particles by weight, or about 1% to about 10% micron-scale metal particles by weight, or about 1% to about 5% micron-scale metal particles by weight. Inclusion of micron-scale metal particles in the nanoparticle paste formulations can desirably reduce the incidence of cracking that occurs during consolidation of the metal nanoparticles. Without being bound by any theory or mechanism, it is believed that the micron-scale metal particles can become consolidated with one another as the metal nanoparticles are liquefied and flow between the micron-scale metal particles. In some embodiments, the micron-scale metal particles can range between about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. More desirably, the micron-scale metal particles can be smaller in size than the wire payout in the embodiments of the present disclosure. The micron-size metal particles can contain the same metal as the metal nanoparticles or contain a different metal. Thus, metal alloys can be fabricated by including micron-size metal particles that differ from the metal nanoparticles in the nanoparticle paste formulations. Suitable micron-scale metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si, P and B can be used in a like manner. In some embodiments, the micron-scale metal particles can be in the form of metal flakes, such as high aspect ratio copper flakes, for example. That is, in some embodiments, the nanoparticle paste formulations described herein can contain a mixture of copper nanoparticles and high aspect ratio copper flakes. Specifically, in some embodiments, the nanoparticle paste formulations can contain about 30% to about 98% copper nanoparticles by weight and about 0.01% to about 15% high aspect ratio copper flakes by weight. Other micron-scale metal particles that can be used equivalently to high aspect ratio metal flakes include, for example, metal nanowires and other high aspect ratio particles, which can be up to 300 microns in length.

In some embodiments, nanoscale conductive additives can also be present in the nanoparticle paste formulations. These additives can desirably provide further structural reinforcement and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation. In some embodiments, the nanoscale conductive additives can have a size in at least one dimension ranging between about 1 micron and about 100 microns, or ranging between about 1 micron and about 300 microns. Suitable nanoscale conductive additives can include, for example, carbon nanotubes, graphene, and the like. When present, the nanoparticle paste formulations can contain about 1% to about 10% nanoscale conductive additives by weight, or about 1% to about 5% nanoscale conductive additives by weight. Additional substances that can also optionally be present include, for example, flame retardants, UV protective agents, antioxidants, carbon black, graphite, fiber materials (e.g., chopped carbon fiber materials), and the like.

In more particular embodiments, metal nanoparticle compositions suitable for use in conjunction with the methods of the present disclosure can include Ni, Ag, Al, Si, P, Zn or any combination thereof in order to promote oxidation resistance. Sn, Pd, Pt, Cr, Co, M, V and Ti can also be present in some embodiments. These additives can be present in a compound form or in an elemental form. Moreover, these additives can be present in the form of nanoparticles or microparticles, or alloyed with nanoparticles or microparticles. In more particular embodiments, metal nanoparticle compositions containing any of the above additives can also contain copper nanoparticles.

One way in which nanoparticle paste formulations can promote a decreased degree of cracking and void formation during metal nanoparticle consolidation is by maintaining a high solids content. More particularly, in some embodiments, the present nanoparticle paste formulations can contain at least about 30% metal nanoparticles by weight, particularly about 30% to about 98% metal nanoparticles by weight of the metal nanoparticle paste formulation, or about 50% to about 90% metal nanoparticles by weight of the metal nanoparticle paste formulation, or about 70% to about 90% metal nanoparticles by weight of the metal nanoparticle paste formulation, or about 80% to about 98% metal nanoparticles by weight of the metal nanoparticle paste formulation, or about 85% to about 98% metal nanoparticles by weight of the metal nanoparticle paste formulation. Moreover, in some embodiments, small amounts (e.g., about 0.01% to about 15% by weight of the nanoparticle paste formulation) of micron-scale metal particles can be present in addition to the metal nanoparticles. Such micron-scale metal particles can desirably promote the fusion of metal nanoparticles into a consolidated mass and further reduce the incidence of cracking. Instead of being liquefied and undergoing fusion, the micron-scale metal particles can simply become joined together when contacted with liquefied metal nanoparticles that have been raised above their fusion temperature.

Decreased cracking and void formation during metal nanoparticle consolidation can also be promoted by judicious choice of the solvent(s) forming the organic matrix of the nanoparticle paste formulations. A tailored combination of organic solvents can promote consolidation of the metal nanoparticles with a decreased incidence of cracking and void formation. More particularly, an organic matrix containing one or more hydrocarbons, one or more alcohols, one or more amines, and one or more organic acids can be especially effective for this purpose. Without being bound by any theory or mechanism, it is believed that this combination of organic solvents can facilitate the removal and sequestration of surfactant molecules surrounding the metal nanoparticles, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In order to promote dispensability through micron-size apertures, the nanoparticle paste formulations can desirably have a low maximum particle size. In some embodiments, the nanoparticle paste formulations can be homogenized to break apart aggregates of metal nanoparticles in order for a low maximum particle size to be realized. Size-based separation techniques can also be employed in some embodiments. In some embodiments, the nanoparticle paste formulations can have a maximum particle size of about 10 microns or less. In other embodiments, the nanoparticle paste formulations can have a maximum particle size of about 5 microns or less, or about 4 microns or less, or about 3 microns or less, or about 2 microns or less, or about 1 microns or less. The maximum particle size may include agglomerates of metal nanoparticles with themselves and with other components of the nanoparticle paste formulations. The viscosity of the nanoparticle paste formulations can also be tailored to promote a desired mode of application in the wire bonding processes of the present disclosure.

Accordingly, in other various embodiments, the present disclosure also describes wire bonding systems that are configured to incorporate metal nanoparticles in the wire bonding process. In various embodiments, the wire bonding systems can include a rolled wire source 12, a dispensation head 16 configured to provide a wire payout from the rolled wire source, and an applicator 55 configured to place a metal nanoparticle composition upon at least a portion of the wire payout or upon a bonding pad. Suitable dispensation heads 16 can include conventional capillary bonding heads or piezoelectric tweezer bonding heads. Suitable applicators 55 configured to place the metal nanoparticle composition can include any of the various components used in dip coating, spray coating, ink jet printing, screen printing, aerosol printing, roller coating, syringe deposition, spreading, painting, stamping, or the like.

In further embodiments, the systems can include a heat source configured to heat the metal nanoparticle composition upon the wire payout or upon the bonding pad. Suitable heat sources include, for example, radiant heaters, lasers, electric arcs, heated gas streams, photolytic heaters (e.g., a xenon lamp) and the like. For example, in the presence of 0.2-8% formic acid, 95% dense interfaces having a conductivity up to about 80% that of bulk copper can be realized through laser sintering or photosintering. Photosintering using a xenon lamp can be particularly rapid (e.g., approximately 2 msec at a power of 0.18 $J/mm^2$ to 0.21 $J/mm^2$).

The systems and methods of the present disclosure can further incorporate a reservoir of the first and/or second metal nanoparticle compositions. For example, in some embodiments, a reservoir of the first and/or second metal nanoparticle compositions can be placed near the dispensation head so as to facilitate application to the wire payout. The amount applied to the wire payout or the bonding pad can be as small as needed to facilitate metallurgical bond formation. The morphology of the first and/or second nanoparticle compositions can be tailored, for example, so that only a small amount of the composition is picked upon brushing of the wire payout through the reservoir.

Although the disclosure has been described with reference to the above embodiments, one of ordinary skill in the art will readily appreciate that these are only illustrative of the disclosure. It should be understood that various modifications can be made without departing from the spirit of the disclosure. The disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description.

What is claimed is the following:

1. An electrical package comprising:
    a bonding pad in electrical communication with an electronic component;
    a lead;
    a plurality of wire loops extending between the bonding pad and the lead; and
    an adhering interface having a nanoparticulate structure disposed between each of the plurality of wire loops and at least one of the bonding pad and the lead,
    wherein the adhering interface has a grain size of 250 nm or less,
    wherein the adhering interface has pores that range in size between about 50 nm to about 500 nm, and
    wherein the nanoparticulate structure is a localized consolidation of metal nanoparticles of a metal nanoparticle composition, and wherein the metal nanoparticle composition is disposed over a region of the bonding pod and includes localized consolidation of metal nanoparticles in the metal nanoparticle composition for each location in the region where contact between one of the plurality of wire loops and the bonding pad exist.

2. The electrical package of claim 1, wherein the adhering interface is present between the plurality of wire loops and both the bonding pad and the lead.

3. The electrical package of claim 1, wherein each of the plurality of wire loops comprises a copper wire, a gold wire, an aluminum wire, a silver wire, carbon nanotube ropes, a drawn carbon nanotube fiber, or any combination thereof.

4. The electrical package of claim 1, wherein the adhering interface is formed from a copper nanoparticle composition.

5. The electrical package of claim 1, wherein each of the plurality of wire loops comprises a copper wire and the adhering interface is formed from a copper nanoparticle composition.

6. The electrical package of claim 1, wherein the lead is disposed on the electronic component.

7. The electrical package of claim 1, wherein each of the plurality of wire loops forms an angle of less than 45 degrees with the bonding pad or lead.

8. The electrical package of claim 7, wherein each of the plurality of wire loops forms an angle of less than 30 degrees with the bonding pad or lead.

9. The electrical package of claim 1, wherein the adhering interface has a grain size ranging between 50 nm and 200 nm.

10. The electrical package of claim 1, wherein the adhering interface has a porosity ranging between 2% and 30%.

11. A wire bonding system comprising:
    a rolled wire source;
    a dispensation head configured to provide a wire payout from the rolled wire source; and
    an applicator configured to place a metal nanoparticle composition upon at least a portion of the wire payout.

12. The wire bonding system of claim 11, further comprising:
    a heat source configured to heat the metal nanoparticle composition upon the wire payout or upon a bonding pad.

13. The wire bonding system of claim 12, wherein the heat source is an electric arc, a laser, direct radiant heating, heated gas, or photolytic heating.

14. The wire bonding system of claim 11, wherein the dispensation head is a piezoelectric tweezer bonding head or a capillary bonding head.

* * * * *